(12) United States Patent
Bohra et al.

(10) Patent No.: US 9,953,701 B1
(45) Date of Patent: Apr. 24, 2018

(54) SRAM ARCHITECTURE WITH BITCELLS OF VARYING SPEED AND DENSITY

(71) Applicant: ARM Limited, Cambridge (GB)

(72) Inventors: Fakhruddin Ali Bohra, Austin, TX (US); Lalit Gupta, Cupertino, CA (US); Shri Sagar Dwivedi, San Jose, CA (US); Jitendra Dasani, Cupertino, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/439,899

(22) Filed: Feb. 22, 2017

(51) Int. Cl.
*G11C 11/34* (2006.01)
*G11C 11/419* (2006.01)
*G11C 11/418* (2006.01)

(52) U.S. Cl.
CPC ......... *G11C 11/419* (2013.01); *G11C 11/418* (2013.01)

(58) Field of Classification Search
CPC ..... G11C 11/412; G11C 11/413; G11C 11/419; H01L 27/11; H01L 27/1104
USPC ...................................... 365/154, 63
See application file for complete search history.

(56) References Cited

U.S. PATENT DOCUMENTS

| 2015/0049563 A1 | 2/2015 | Maiti et al. |
| 2015/0098160 A1 * | 4/2015 | Gao ................. H03K 17/0822 361/86 |

* cited by examiner

*Primary Examiner* — Son Dinh
(74) *Attorney, Agent, or Firm* — Pramudji Law Group PLLC; Ari Pramudji (57) ABSTRACT

An SRAM with a first bitcell array having a first density and a first access speed, and a second bitcell array having a second density larger than the first density and a second access speed less than the first access speed. The SRAM further includes a first set of wordline drivers coupled to the first bitcell array, a second set of wordline drivers coupled to the second bitcell array, and a row decoder coupled to both the first and second bitcell arrays.

20 Claims, 5 Drawing Sheets

SRAM ARCHITECTURE WITH BITCELLS OF VARYING SPEED AND DENSITY

BACKGROUND

Traditionally, SRAM (Static Random Access Memory) is designed by tiling together instances of a bitcell into a bitcell array. An individual bitcell may be optimized to achieve various objectives. For example, for some applications a bitcell may be optimized for high density at the expense of relatively slow read and write operations, whereas for other applications a bitcell may be optimized for high speed operation at the expense of occupying a larger die area.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Embodiments described herein provide an efficient architecture and design methodology for utilizing within a single SRAM two different kinds of bitcells, in particular high speed bitcells and high density bitcells. In some embodiments, an SRAM having a butterfly architecture includes high speed bitcells for a high speed bitcell array one side of the butterfly architecture, and high density bitcells for a high density bitcell array the other side of the butterfly architecture. Various row decoder, clock generator, input buffer and latches, and row access circuits are shared by the two bitcell arrays, where self-timed paths are separately tuned for the two bitcell arrays.

Figure 1:
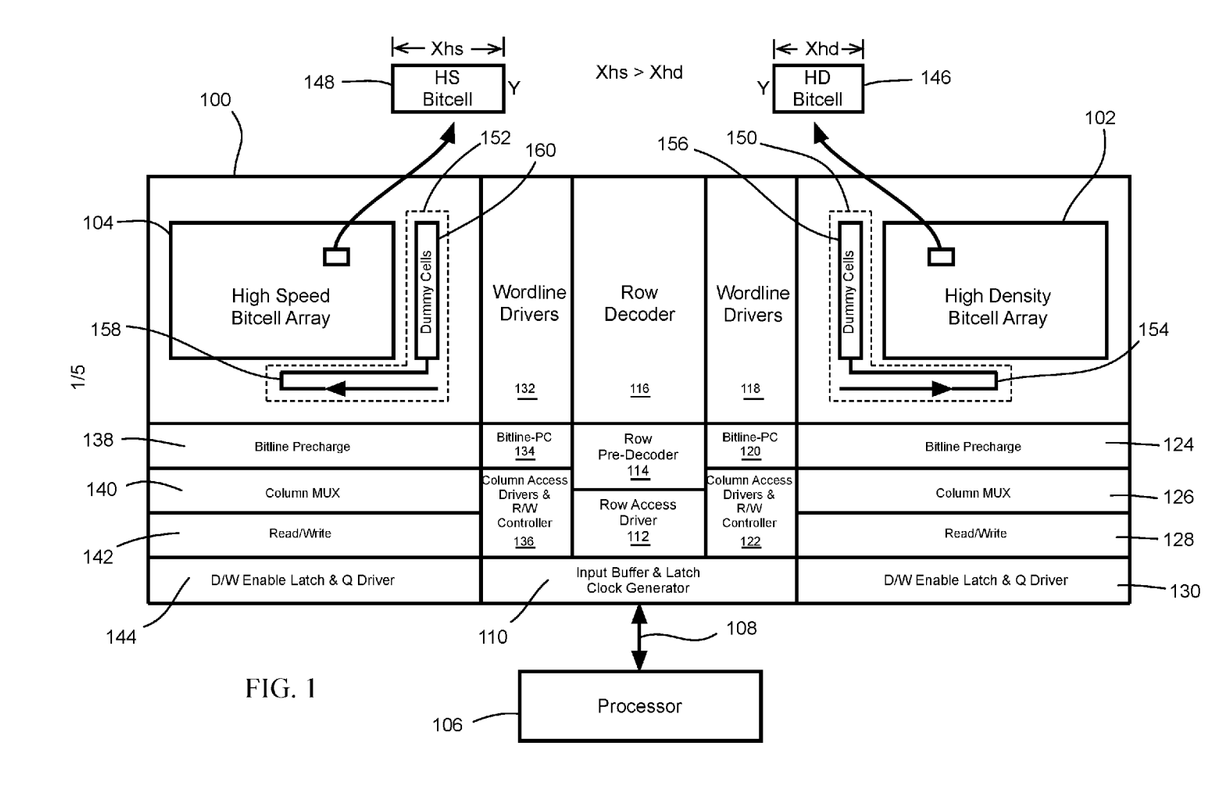
FIG. 1 illustrates a floorplan for an SRAM having a butterfly architecture in accordance with implementations described herein.

FIG. 1 illustrates a floorplan for an SRAM 100 having a butterfly architecture, where a high density bitcell array 102 occupies one side (i.e., is placed in a first half) of the butterfly architecture and a high speed bitcell array 104 occupies the other side (i.e., is placed in a second half) of the butterfly architecture. A processor 106 accesses the SRAM 100 by way of a bus or interconnect 108. For ease of illustration, a memory controller is not illustrated in FIG. 1, but may be integrated with the processor 106. The processor 106 may represent one or more processors, each one having one or more processor cores. Although the SRAM 100 is illustrated as a component separate from the processor 106, in some implementations the SRAM 100 may be integrated with the processor 106. The SRAM 100 may be part of a memory hierarchy, such as a cache.

As their names imply, the high density bitcell array 102 has a higher density of individual bitcells than that of the high speed bitcell array 104, but at the expense of slower read and write operations than that of the high speed bitcell array 104. In some implementations, the processor 106 may independently access the high density bitcell array 102 or the high speed bitcell array 104. In other implementations, the high density bitcell array 102 and the high speed bitcell array 104 may share the same address space, where when reading or writing a word, the high density bitcell array 102 represents a subset of the word and the high speed bitcell array represents the remaining portion of the word. For example, the high density bitcell array 102 may represent the higher order bits of a word whereas the high speed bitcell array 104 may represent the lower order bits of the word.

A single interface may be shared by the high density bitcell array 102 and the high speed bitcell array 104. Illustrated in the particular example of FIG. 1 are several functional units shared by the high density bitcell array 102 and the high speed bitcell array 104: a functional unit 110 to provide the functionalities of an input buffer and latch, and a clock generator; a row access driver 112; a row pre-decoder 114; and a row decoder 116.

The high density bitcell array 102 has its own dedicated wordline drivers 118, a bitline precharge decoder 120, and a functional unit 122 to provide the functionalities of column access drivers and a read/write controller. Furthermore, the high density bitcell array 102 has its own bitline precharge functional unit 124, a column multiplexer 126, a read/write functional unit 128, and a functional unit 130 to provide the data and write enable latches and a data (Q) driver.

The functional units shared by both the high density bitcell array 102 and the high speed bitcell array 104 occupy a central portion of the butterfly architecture of the SRAM 100.

Similarly, the high speed bitcell array 104 has its own dedicated wordline drivers 132, a bitline precharge decoder 134, and a functional unit 136 to provide the functionalities of column access drivers and a read/write controller. Furthermore, the high speed bitcell array 104 has its own bitline precharge functional unit 138, a column multiplexer 140, a read/write functional unit 142, and a functional unit 144 to provide data and write enable latches and a data (Q) driver.

The groupings of the various functionalities illustrated in FIG. 1 are made for ease of illustration and are not meant to imply a particular layout of functional units. As a particular example, the functional unit 110 is illustrated as having the functionalities of an input buffer and latch, and a clock generator. It is somewhat arbitrary whether such functionalities are represented as separate functional units or as one functional unit. Similar remarks apply to the other functional units illustrated in FIG. 1.

The high density bitcell 146 and the high speed bitcell 148 illustrate the relative dimensions of the individual bit cells in the high density bitcell array 102 when compared to that of the high speed bitcell array 104. Each of these bitcells have the same height indicated by the variable "Y" in FIG. 1. That is, each bitcell in the two different types of bitcell arrays has the same sized dimension in a direction parallel to the bitline orientation (the vertical orientation with respect to the drawing of FIG. 1). However, for the high density bitcell array 102, the dimension of the bitcell 146 in a direction perpendicular to the bitline orientation (horizontal orientation), represented by "Xhd" in FIG. 1, is less than that of the high speed bitcell 148 represented by "Xhs" in FIG. 1. Each bitcell having the same value for the dimension taken in a direction parallel to the bitlines (orthogonal to the wordiness) facilitates in an efficient layout of the high density bitcell array 102 and the high speed bitcell array 104 in the SRAM 100.

Figure 2:
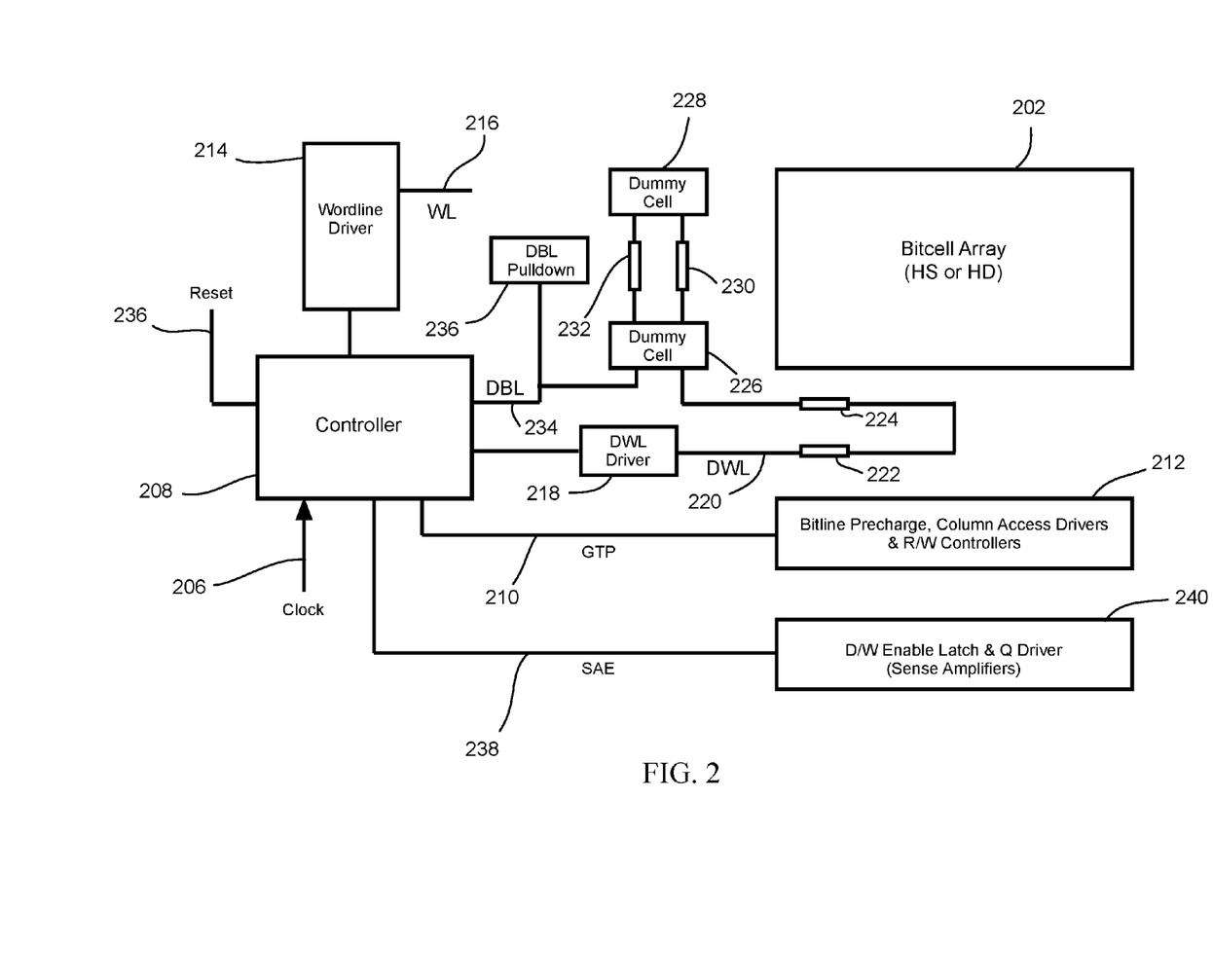
FIG. 2 illustrates a self-timed path for a bitcell array in accordance with implementations described herein.

A self-timed path 150 is associated with the high density bitcell array 102, and a self-timed path 152 is associated with the high speed bitcell array 104. The self-timed path 150 includes a wordline path 154 representing signal propagation along a dummy wordline for column tracking of the high density bitcell array 102, and a path of dummy cells 156 for row tracking of bitcells in the high density bitcell array 102. Similarly, the self-timed path 152 includes a wordline path 158 for representing signal propagation along a dummy wordline for column tracking of the high speed bitcell array 104, and a path of dummy cells 160 for row tracking of bitcells in the high speed bitcell array 104. The self-timed paths 150 and 152 are tuned for their respective bitcell arrays to provide timing that tracks PVT (Process-Voltage-Temperature) variations, and to provide sufficient timing margin to account for the slowest bitcell in their respective bitcell arrays. FIG. 2 provides a more detailed illustration of the self-timed paths 150 and 152.

Figure 3:
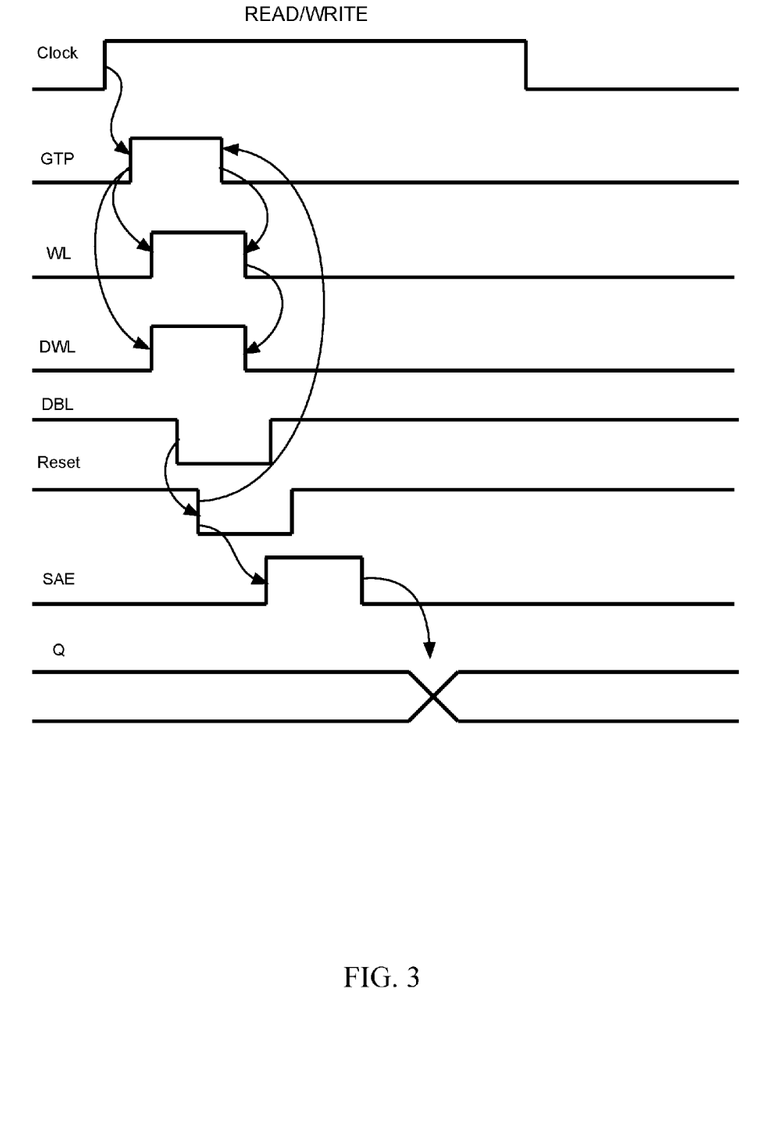
FIG. 3 illustrates signal timing for a self-timed path of a bitcell array in accordance with implementations described herein.

FIG. 2 illustrates a self-timed path for either of the high density bitcell array 102 or the high speed bitcell array 104, where a bitcell array 202 represents either the high density bitcell array 102 or the high speed bitcell array 104. FIG. 3 illustrates the timing of various signals illustrated in the self-timed path of FIG. 2.

Referring to FIG. 2, a clock signal 206 is provided to a controller 208. For example, the clock generator function of the functional unit 110 may provide the clock signal 206, where the clock signal 206 is asserted HIGH to begin a read or write operation. This is illustrated by the signal labeled "clock" in FIG. 3. In response to the clock signal 206 being asserted HIGH, the controller 208 asserts an internal clock signal 210, denoted as GTP in FIG. 2 and FIG. 3. The internal clock signal GTP is provided to various functional units for beginning a read or write operation, such as precharging the bitlines and enabling various column access drivers and read/write controllers, as represented by a functional unit 212 in FIG. 2.

Corresponding to the controller 208 asserting the GTP internal clock signal, a wordline driver 214 is enabled to assert a wordline (WL) signal 216. The particular wordline asserted depends upon the memory address of the word to be written or read, where for ease of illustration only one wordline signal is illustrated. Furthermore, a dummy wordline driver 218 is enabled to assert a dummy word line (DWL) signal 220. These signals are illustrated in FIG. 3 and labeled, respectively, as WL and DWL.

Delay elements 222 and 224 represent propagation delay of the DWL signal 220, where the propagation delay represented by the delay elements 222 and 224 is tuned (designed) so that the DWL signal 220 tracks signal propagation delay along the wordlines (column tracking) within the bitcell array 202. The DWL signal 220 serves as a wordline signal to a plurality of dummy cells, where for ease of illustration two dummy cells are represented and labeled in FIG. 2 as 226 and 228. A delay element 230 represents signal propagation of the dummy wordline signal 220 along the dummy bitcells, and a delay element 232 represents signal propagation of a dummy bitline (DBL) signal 234 along the dummy bitcells. The signal propagation represented by delay elements 230 and 232 is tuned (designed) so that the dummy bitline (DBL) signal 234 tracks signal propagation delay across the rows of bitcells in the bitcell array 202.

The dummy cells (e.g., the dummy cells 226 and 228) are each configured to a fixed state so that the DBL signal 234 is pulled up or pulled down on every read/write cycle depending upon the particular convention that is followed. For example, the dummy cells may be configured to pull down the DBL signal 234, where a DBL pulldown 236 may be added to tune the pulldown so that the dummy cells properly perform row tracking of the bit ell array 202. In some instances, the SRAM 100 may be configured with complementary bitlines for each bitcell, so that both a DBL signal 234 and the logical complement of the DBL signal 234 are available. In such instances, a DBL pullup may be utilized for row tracking, but for ease of illustration the logical complements to the DBL signal 234 and the DBL pulldown 236 are not shown. In FIG. 3, the DBL signal 234 (the signal labeled "DBL") is shown being pulled LOW at some time delay following the assertion of the DWL signal.

In response to sensing that the DBL signal 234 has been pulled LOW, the controller 208 de-asserts a reset signal 236 so that various signals return to their quiescent state. For example, as indicated in FIG. 3, in response to the reset signal 236 (labeled "reset") being pulled LOW, the GTP internal clock signal is de-asserted, followed by de-asserting the WL and DWL signals. Furthermore, in response to the reset signal being pulled LOW, the controller 208 asserts a sense amplifier enable (SAE) signal 238 (labeled "SAE" in FIG. 3) to enable various sense amplifiers and circuits in the appropriate functional units for reading or writing data to the bitcell array 202. In FIG. 2, a functional unit 240 represents the various circuits that are enabled by the SAE signal 238. For a read operation, after some time delay (CLK2Q), valid data is available from the SRAM 100 as indicated by the signal labeled "Q" in FIG. 3.

It is to be understood in the description of the embodiments that it is a matter of design choice whether a signal is asserted HIGH or de-asserted LOW so as to cause a desired action. For example, in the particular embodiment described above and as illustrated in FIG. 3, the reset signal is pulled (de-asserted) LOW to indicate that the various other signals are to be put into their respective quiescent states. Such a convention has an advantage that if power is interrupted, the reset signal 236 automatically goes LOW. Nevertheless, it is to be appreciated that the various signals illustrated in FIG. 3 are merely examples of particular embodiments, in that various conventions may be followed as to whether a particular signal is asserted or de-asserted to cause a desired action.

Figure 4:
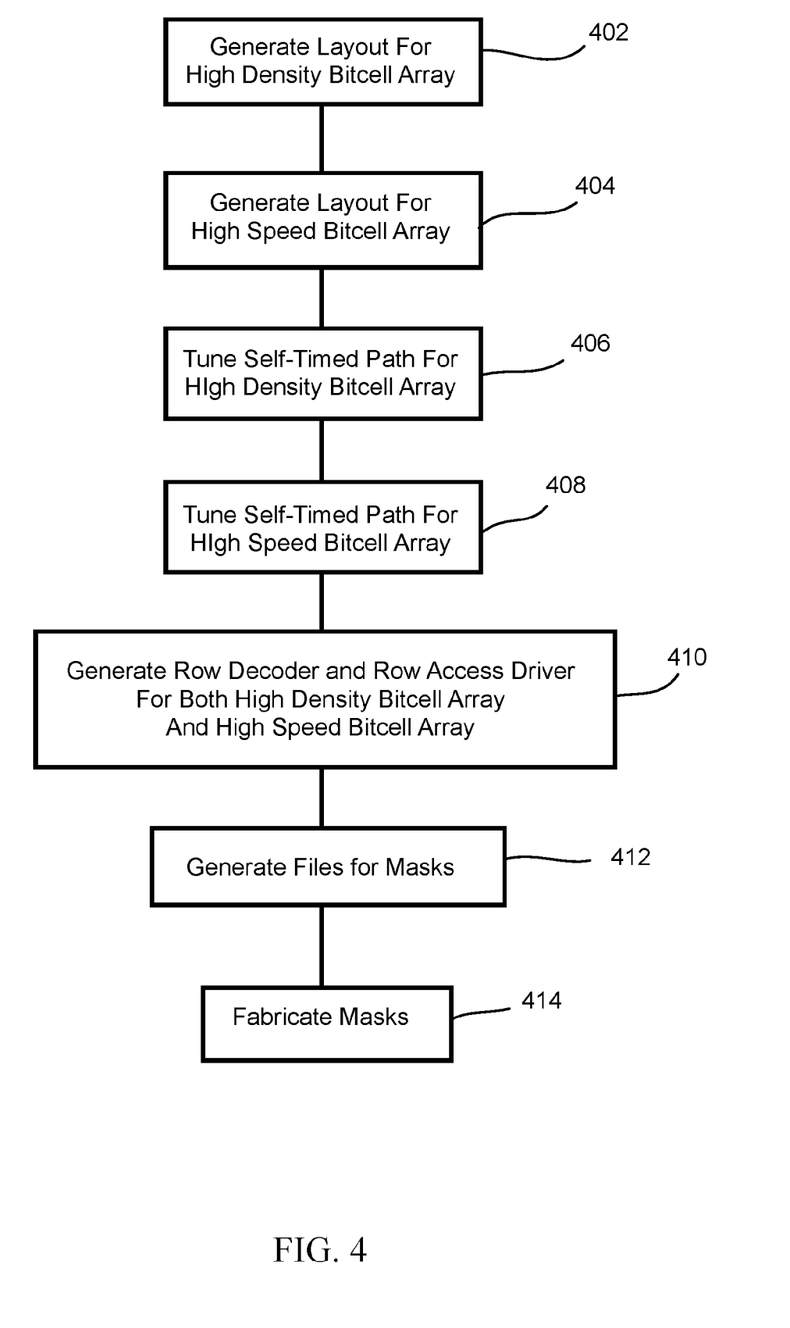
FIG. 4 illustrates a design process for a memory in accordance with implementations described herein.

By utilizing a butterfly architecture design methodology, the SRAM 100 can be designed so that various functionalities, such as the clock generator provided by the functional unit 110 and row access provided by the row decoder 116, are shared by both sides of the SRAM 100, namely the high density bitcell array 102 and the high speed bitcell array 104. This allows incorporation of both types of memory into a single SRAM 100, thereby allowing the efficient allocation of memory resources in a chip application. In this way, the processor 106 may relatively quickly read or write some bits of a word in memory when needed, whereas other word bits in memory for which a higher latency may be tolerated can be stored with higher density. FIG. 4 illustrates this design methodology.

Referring to FIG. 4, in step 402 a layout for a high density bitcell array is generated, and in step 404 a layout for a high speed bitcell array is generated. Generating a layout for a bitcell array includes forming many instances of a bitcell, and tiling together the instances of the bitcell. Associated with each bitcell array layout is a self-timed path, where in step 406 the self-timed path associated with the high density bitcell array is tuned so that there is proper column and row tracking, as described with respect to the embodiment of FIG. 2. Similarly, in step 408 the self-timed path associated with the high speed bitcell array is tuned for proper column and row tracking. In step 410, various functional units are generated (designed) that are shared by the high speed bitcell array and the high density bitcell array. For example, a layout for a row decoder and row access drivers can be generated in step 410. There are many steps performed to generate files appropriate for mask fabrication, but the process as illustrated in FIG. 4 only specifically shows several such steps. Step 412 represents that part of the process in which various files for mask fabrication according to any number of well-known formats are generated, where in step 414 one or more masks are fabricated for manufacturing an integrated chip that includes the SRAM 100.

The steps illustrated in the flow diagram of FIG. 4 need not be performed in the order illustrated. For example, step 406 may follow step 402 before performing step 404. Furthermore, various steps may be iterated in the design process.

Figure 5:
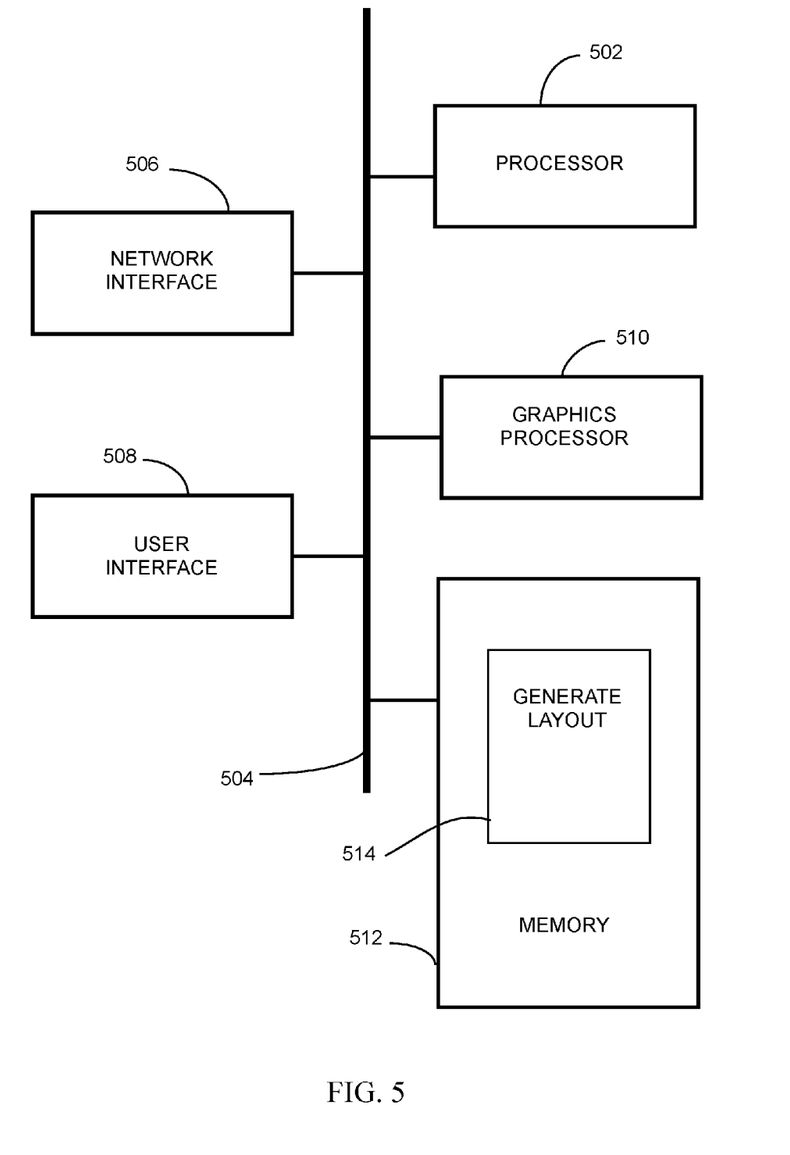
FIG. 5 illustrates a programmable computing platform to implement the design process of FIG. 4 in accordance with implementations described herein.

Many of the steps illustrated by the process of FIG. 4 may be performed by a programmable computing platform such as that illustrated in FIG. 5. FIG. 5 illustrates a processor 502 coupled by way of an interconnect or bus 504 to various other functional units, such as a network interface 506, a user interface 508, a graphics processor 510, and a system memory 512. The processor 502 represents one or more processors, were each processor may comprise one or more processor cores. The system memory 512 may be part of a memory hierarchy, or some components of the memory hierarchy may be embedded on the same chip as the processor 502. Module 514 illustrates instructions stored in the memory 512 that when executed by the processor 502 cause the programmable computing platform of FIG. 5 to perform the circuit layout generation as described with respect to the process of FIG. 4.

Various embodiments have been described within the context of the SRAM 100, but in general embodiments are not limited to SRAM, and need be limited to a particular kind of port structure, such as single or dual ported memories. Circuit structures other than SRAM bitcells and associated circuitry may be used in a memory with a butterfly architecture as illustrated in FIG. 1. For example, memory types in other embodiments may include ROM (Read Only Memory), as well as dual port or pseudo dual port variations of ROM and SRAM.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of an integrated circuit comprising a memory, where the memory includes a first bitcell array having a first density and a first access speed, a second bitcell array having a second density larger than the first density and a second access speed less than the first access speed, a first set of wordline drivers coupled to the first bitcell array, a second set of wordline drivers coupled to the second bitcell array, and a row decoder coupled to both the first and second bitcell arrays.

Described herein are various implementations of a method, where the method comprises generating a first layout for a first bitcell array having a first density and a first access speed, generating a second layout for a second bitcell array having a second density larger than the first density and a second access speed less than the first access speed, generating a third layout for a first set of wordline drivers coupled to the first bitcell array, generating a fourth layout for a second set of wordline drivers coupled to the second bitcell array, generating a fifth layout for a row decoder coupled to both the first and second bitcell arrays, and fabricating one or more masks according to the first, second, third, fourth, and fifth layouts.

Described herein are various implementations of a memory having a butterfly architecture. The memory includes a first bitcell array in a first half of the butterfly architecture of the memory, where the first bitcell array includes a first plurality of bitcells, and wherein each bitcell in the first plurality of bitcells has a first dimension and a second dimension. The memory further includes a second bitcell array in a second half of the butterfly architecture of the memory, where the second bitcell array includes a second plurality of bitcells, and wherein each bitcell in the second plurality of bitcells has a first dimension and a second dimension. The first dimension of the bitcells in the first plurality of bitcells is larger in value than the first dimension of the bitcells in the second plurality of bitcells, and the second dimension of the bitcells in the first plurality of bitcells is substantially the same in value as the second dimension of the bitcells in the second plurality of bitcells. The memory further includes a first set of wordline drivers coupled to the first bitcell array, a second set of wordline drivers coupled to the second bitcell array, and a row decoder coupled to both the first and second bitcell arrays.

Reference has been made in detail to various implementations, examples of which are illustrated in the accompanying drawings and figures. Numerous specific details are set forth to provide a thorough understanding of the disclosure provided herein. However, the disclosure provided herein may be practiced without these specific details. In some other instances, well-known methods, procedures, components, circuits, and networks have not been described in detail so as not to unnecessarily obscure details of the embodiments.

If one or more circuits are used to realize some or all instances of an embodiment, reference may be made to a node or terminal of a circuit or circuit element as an input port or an output port. For a circuit in which a port is a two terminal structure (e.g., circuits modeled as lumped-parameter systems), a recited node or terminal forms one terminal of the two terminal structure, where it is understood that a ground rail (or substrate) serves as another terminal of the two terminal structure.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A circuit comprising:
   a memory comprising:
   a first bitcell array having a first density and a first access speed;
   a second bitcell array having a second density larger than the first density and a second access speed less than the first access speed;
   a first set of wordline drivers coupled to the first bitcell array;
   a second set of wordline drivers coupled to the second bitcell array; and
   a row decoder coupled to both the first and second bitcell arrays.

2. The circuit as set forth in claim 1, further comprising:
   a processor coupled to the memory to read and write words stored in the memory,
   wherein the first bitcell array provides a first set of bits for the words stored in the memory and the second bitcell array provides a second set of bits for the words stored in the memory.

3. The circuit as set forth in claim 2, wherein the processor accesses the first and second bitcell arrays with a single address space.

4. The circuit as set forth in claim 1, further comprising a processor accesses the first and second bitcell arrays with a single address space.

5. The circuit as set forth in claim 1, further comprising:
   a first self-timed path coupled to the first bitcell array; and
   a second self-timed path coupled to the second bitcell array.

6. The circuit as set forth in claim 5, wherein the first self-timed path is tuned to the first bitcell array, and the second self-timed path is tuned to the second bitcell array.

7. The circuit as set forth in claim 1, wherein
   the first bitcell array comprises a first plurality of bitcells, each bitcell in the first plurality of bitcells having a first dimension and a second dimension; and
   the second bitcell array comprises a second plurality of bitcells, each bitcell in the second plurality of bitcells having a first dimension and a second dimension,
   wherein the first dimension of each bitcell in the first plurality of bitcells is larger in value than the first dimension of each bitcell in the second plurality of bitcells, and the second dimension of each bitcell in the first plurality of bitcells is substantially the same in value as the second dimension of each bitcell in the second plurality of bitcells.

8. The circuit as set forth in claim 7, wherein the memory further comprises wordlines, wherein the first dimension of each bitcell in the first plurality of bitcells is oriented substantially parallel to the wordlines, and the first dimension of each bitcell in the second plurality of bitcells is oriented substantially parallel to the wordlines.

9. The circuit as set forth in claim 7, further comprising:
a processor coupled to the memory to read and write words stored in the memory,
wherein the first bitcell array provides a first set of bits for the words stored in the memory and the second bitcell array provides a second set of bits for the words stored in the memory.

10. The circuit as set forth in claim 9, wherein the processor accesses the first and second bitcell arrays with a single address space.

11. The circuit as set forth in claim 10, further comprising:
a first self-timed path coupled to the first bitcell array; and
a second self-timed path coupled to the second bitcell array.

12. The circuit as set forth in claim 11, wherein the first self-timed path is tuned to the first bitcell array, and the second self-timed path is tuned to the second bitcell array.

13. A method comprising:
generating a first layout for a first bitcell array having a first density and a first access speed;
generating a second layout for a second bitcell array having a second density larger than the first density and a second access speed less than the first access speed;
generating a third layout for a first set of wordline drivers coupled to the first bitcell array;
generating a fourth layout for a second set of wordline drivers coupled to the second bitcell array;
generating a fifth layout for a row decoder coupled to both the first and second bitcell arrays; and
fabricating one or more masks according to the first, second, third, fourth, and fifth layouts.

14. The method as set forth in claim 13, further comprising:
generating a sixth layout for a first self-timed path for the first bitcell array;
tuning the sixth layout for the first self-timed path to provide column and row tracking of the first bitcell array;
generating a seventh layout for a second self-timed path for the second bitcell array; and
tuning the seventh layout for the second self-timed path to provide column and row tracking of the second bitcell array.

15. The method as set forth in claim 14, wherein generating the first layout for the first bitcell array further comprises tiling instances of a first bitcell, the first bitcell having a first dimension and a second dimension; and generating the second layout for the second bitcell array further comprises tiling instances of a second bitcell, the second bitcell having a first dimension and a second dimension,
wherein the first dimension of the first bitcell is larger in value than the first dimension of the second bitcell, and the second dimension of the first bitcell is substantially the same in value as the second dimension of the second bitcell.

16. A memory having a butterfly architecture, the memory comprising:
a first bitcell array in a first half of the butterfly architecture of the memory, the first bitcell array comprising a first plurality of bitcells, wherein each bitcell in the first plurality of bitcells has a first dimension and a second dimension;
a second bitcell array in a second half of the butterfly architecture of the memory, the second bitcell array comprising a second plurality of bitcells, wherein each bitcell in the second plurality of bitcells has a first dimension and a second dimension, wherein the first dimension of the bitcells in the first plurality of bitcells is larger in value than the first dimension of the bitcells in the second plurality of bitcells, and the second dimension of the bitcells in the first plurality of bitcells is substantially the same in value as the second dimension of the bitcells in the second plurality of bitcells;
a first set of wordline drivers coupled to the first bitcell array;
a second set of wordline drivers coupled to the second bitcell array; and
a row decoder coupled to both the first and second bitcell arrays.

17. The memory as set forth in claim 16, further comprising:
a first self-timed path coupled to the first bitcell array; and
a second self-timed path coupled to the second bitcell array.

18. The memory as set forth in claim 17, wherein the first self-timed path is tuned to the first bitcell array, and the second self-timed path is tuned to the second bitcell array.

19. The memory as set forth in claim 16, wherein the row decoder is in a central portion of the butterfly architecture of the memory.

20. The memory as set forth in claim 19, further comprising:
a first self-timed path in the first half of butterfly architecture of the memory and coupled to the first bitcell array; and
a second self-timed path in the second half of butterfly architecture of the memory and coupled to the second bitcell array.

* * * * *